(12) United States Patent
Im

(10) Patent No.: US 11,462,834 B2
(45) Date of Patent: *Oct. 4, 2022

(54) ANTENNA MODULE AND ELECTRONIC DEVICE INCLUDING THE SAME

(71) Applicant: Samsung Electro-Mechanics Co., Ltd., Suwon-si (KR)

(72) Inventor: Young Kyoon Im, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/234,857

(22) Filed: Apr. 20, 2021

(65) Prior Publication Data

US 2021/0242593 A1 Aug. 5, 2021

Related U.S. Application Data

(63) Continuation of application No. 16/507,096, filed on Jul. 10, 2019, now Pat. No. 11,011,844.

(30) Foreign Application Priority Data

Dec. 14, 2018 (KR) .................. 10-2018-0161880

(51) Int. Cl.
*H01Q 9/04* (2006.01)
*H01Q 1/22* (2006.01)
(Continued)

(52) U.S. Cl.
CPC ........... *H01Q 9/045* (2013.01); *H01L 23/057* (2013.01); *H01L 23/3128* (2013.01);
(Continued)

(58) Field of Classification Search
CPC ... H01Q 9/045; H01L 23/057; H01L 23/3128; H01L 23/367; H01L 23/5383; H01L 23/5386; H01L 23/5387
See application file for complete search history.

(56) References Cited

U.S. PATENT DOCUMENTS

| | | | |
|---|---|---|---|
| 9,343,817 B2 | 5/2016 | Pan | |
| 2013/0141284 A1* | 6/2013 | Jeong | H01Q 1/2283 343/700 MS |
| 2018/0026341 A1* | 1/2018 | Mow | H01Q 21/065 343/702 |

FOREIGN PATENT DOCUMENTS

KR 10-2010-0066080 A 6/2010

* cited by examiner

*Primary Examiner* — Wei (Victor) Y Chan
(74) *Attorney, Agent, or Firm* — NSIP Law

(57) ABSTRACT

An antenna module includes: an antenna package including a patch antenna; an integrated circuit (IC) package including an IC; a connection member configured such that a portion of the connection member is disposed between the antenna package and the IC package, and having a laminated structure electrically connecting the patch antenna to the IC; and a chip antenna disposed on the connection member and including a first electrode electrically connected to the IC, a dielectric body disposed on a surface of the first electrode, and a second electrode spaced apart from the first electrode and disposed on the dielectric body. The connection member includes a first region disposed between the antenna package and the IC package, and a second region extending farther than the antenna package in a direction different from a direction in which the connection member is laminated. The chip antenna is disposed in the second region.

20 Claims, 11 Drawing Sheets

(51) Int. Cl.
*H01Q 1/48* (2006.01)
*H01L 23/31* (2006.01)
*H01L 23/538* (2006.01)
*H01L 23/552* (2006.01)
*H01L 23/367* (2006.01)
*H01L 23/66* (2006.01)
*H01L 23/057* (2006.01)

(52) U.S. Cl.
CPC ........ *H01L 23/367* (2013.01); *H01L 23/5383* (2013.01); *H01L 23/5386* (2013.01); *H01L 23/5387* (2013.01); *H01L 23/5389* (2013.01); *H01L 23/552* (2013.01); *H01L 23/66* (2013.01); *H01Q 1/2283* (2013.01); *H01Q 1/48* (2013.01); *H01L 2223/6672* (2013.01); *H01L 2223/6677* (2013.01)

ANTENNA MODULE AND ELECTRONIC DEVICE INCLUDING THE SAME

CROSS-REFERENCE TO RELATED APPLICATIONS

This application is a continuation of U.S. application Ser. No. 16/507,096 filed on Jul. 10, 2019, which claims the benefit under 35 USC § 119(a) of Korean Patent Application No. 10-2018-0161880 filed on Dec. 14, 2018 in the Korean Intellectual Property Office, the entire disclosure of which is incorporated herein by reference for all purposes.

BACKGROUND

1. Field

The following description relates to an antenna module, and an electronic device including an antenna module.

2. Description of Related Art

Data traffic of mobile communications is increasing rapidly every year. Technological development to support such a leap in data amounts transmitted in real time in wireless networks is underway. For example, applications of the contents of Internet of Things (IoT) based data, live VR/AR in combination with augmented reality (AR), virtual reality (VR), and social networking services (SNS), autonomous navigation, a synch view for real-time image transmission from a user's viewpoint using a subminiature camera, and the like, require communications for supporting the exchange of large amounts of data, for example, 5th generation (5G) communications, mmWave communications, or the like.

Thus, millimeter wave (mmWave) communications including 5G (5G) communications have been actively researched, and research into commercialization/standardization of radio frequency modules to smoothly implement such millimeter wave (mmWave) communications has been undertaken.

Radio frequency (RF) signals in high frequency bands (e.g., 28 GHz, 36 GHz, 39 GHz, 60 GHz, or the like) are easily absorbed in the course of transmission and lead to loss. Thus, the quality of communications may decrease dramatically. Therefore, antennas for communications in high-frequency bands require an approach different from the antenna technology of the related art, and may require a special technological development, such as for a separate power amplifier, for providing an antenna gain, integration of an antenna and an RFIC, and effective isotropic radiated power (EIRP), or the like.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an antenna module includes: an antenna package including a patch antenna; an integrated circuit (IC) package including an IC; a connection member configured such that a portion of the connection member is disposed between the antenna package and the IC package, and having a laminated structure electrically connecting the patch antenna to the IC; and a chip antenna disposed on the connection member and including a first electrode electrically connected to the IC, a dielectric body disposed on a surface of the first electrode, and a second electrode spaced apart from the first electrode and disposed on the dielectric body. The connection member includes a first region disposed between the antenna package and the IC package, and a second region extending farther than the antenna package in a direction different from a direction in which the connection member is laminated. The chip antenna is disposed in the second region.

The antenna package may further include a dielectric layer, and the connection member may further include an insulating layer having a flexibility greater than a flexibility of the dielectric layer.

A portion of the insulating layer may provide an arrangement space of the chip antenna. The dielectric body may have a flexibility greater than the flexibility of the dielectric layer.

The connection member may further include: a first feed line electrically connecting the patch antenna and the IC to each other; a second feed line electrically connecting the first electrode and the IC to each other; and a ground layer disposed between at least a portion of each of the first and second feed lines and the patch antenna.

A portion of the ground layer and a remaining portion of the ground layer may be disposed in the first and second regions, respectively. The second electrode may be electrically connected to the ground layer.

The connection member may further include a third region extending farther than the antenna package, in a direction different from the direction in which the second region extends. The third region may provide a layout space of a base signal line through which a base signal, having a frequency lower than a frequency within a bandwidth of the chip antenna, passes.

The IC package may further include: a core member spaced apart from the IC, and including a core via and a core insulating layer; a first electrical connection structure electrically connecting an end of the core via to the connection member; and a second electrical connection structure electrically connected to another end of the core via.

The IC package may further include: a plating member disposed on the core member; and a heat slug disposed on an inactive surface of the IC and electrically connected to the plating member. The IC may electrically connected to the connection member by an active surface of the IC.

The IC package may further include: a passive component electrically connected to the connection member; and an encapsulant sealing the IC and the passive component.

The second region of the connection member may include: a rigid region providing a layout space of the chip antenna; and a flex region connecting the first region of the connection member to the rigid region. The flex region may be more flexible than the rigid region.

The antenna module may further include a second chip antenna disposed in the second region and spaced apart from the chip antenna.

The antenna module may further include a second chip antenna spaced apart from the chip antenna. The connection member may further include a third region extending farther than the antenna package, in a direction different from the direction in which the second region extends. The connection member may provide a layout space of the second chip antenna.

The patch antenna may include patch antenna patterns spaced apart from each other. The antenna package may further include feed vias electrically connected to the connection member and electrically connected to the patch antennas, respectively.

The patch antenna may further include: coupling patch patterns spaced apart from each other and spaced apart from the patch antenna patterns; and a coupling structure disposed to surround the patch antenna patterns.

In another general aspect, an electronic device includes: a case; a set substrate disposed in the case; and an antenna module disposed in the case and electrically connected to the set substrate. The antenna module incudes: an antenna package including a patch antenna; an integrated circuit (IC) package including an IC; a connection member configured such that a portion of the connection member is disposed between the antenna package and the IC package, and having a laminated structure electrically connecting the patch antenna to the IC; and a chip antenna disposed on the connection member and including a first electrode electrically connected to the IC, a dielectric body disposed on a surface of the first electrode, and a second electrode spaced apart from the first electrode and disposed on the dielectric body. The connection member includes a first region disposed between the antenna package and the IC package, and a second region extending farther than the antenna package in a direction different from a direction in which the connection member is laminated. The chip antenna is disposed in the second region.

The patch antenna may be disposed such that a plane of the patch antenna faces an upper surface of the case or a lower surface of the case. A distance by which the chip antenna is spaced from a side surface of the case may be less than a distance by which the patch antenna is spaced from the side surface of case.

The connection member may further include a third region extending farther than the antenna package in a direction different from the direction in which the second region extends. The third region may extend to the set substrate.

The patch antenna may be disposed such that a plane of the patch antenna faces a side surface of the case. A distance by which the chip antenna is spaced from the side surface of the case may be greater than a distance by which the patch antenna is spaced from the case.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
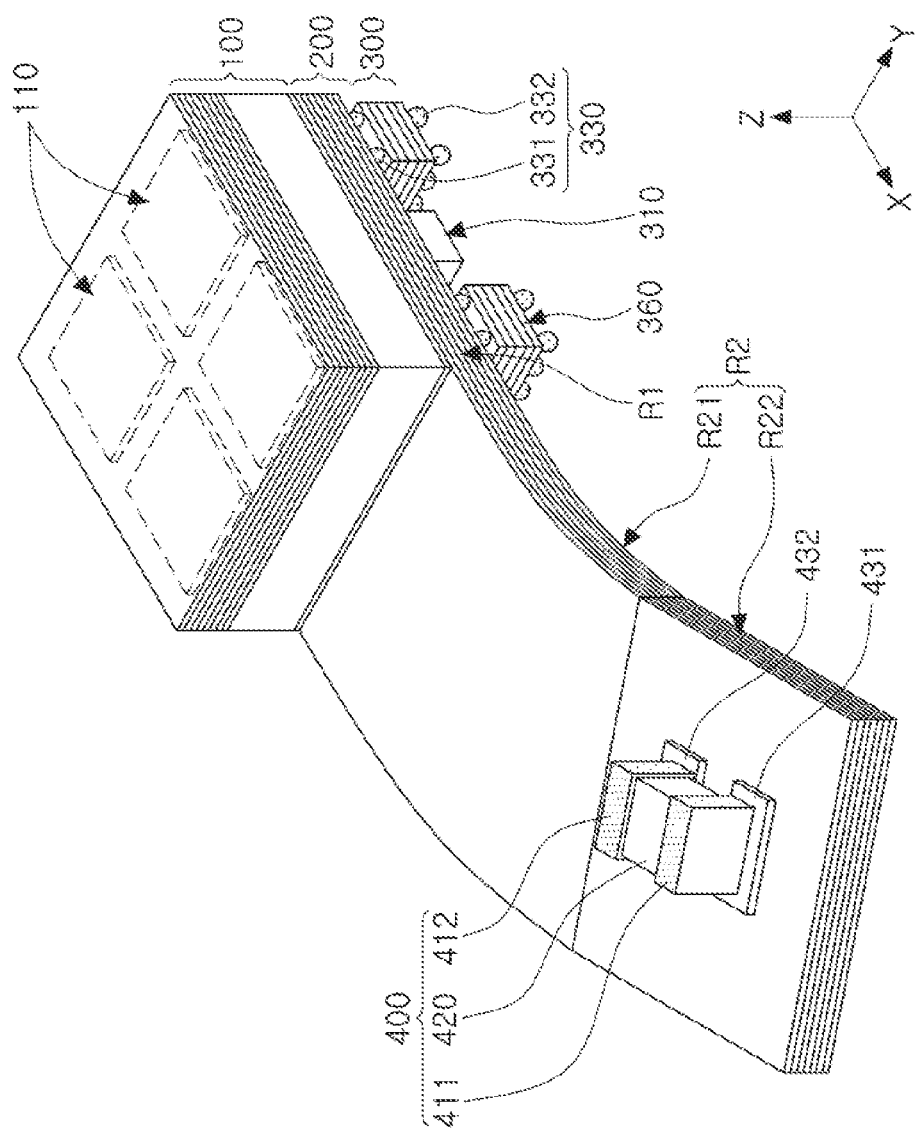
FIG. 1 is a perspective view illustrating an antenna module, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a perspective view illustrating an antenna module, according to an example.

Referring to FIG. 1, the antenna module includes an antenna package 100, a connection member 200, an integrated circuit (IC) package 300, and a chip antenna 400.

The antenna package 100 includes a patch antenna 110 and may further include a dielectric layer 140 (FIG. 2A), and may remotely transmit and/or receive a radio frequency (RF) signal in a Z direction.

The patch antenna 110 may be designed to have a relatively high transmission efficiency with respect to a frequency band corresponding to a frequency of the RF signal. The patch antenna 110 may have an upper plane and a lower plane. The upper/lower plane may serve as an interfacial surface between a conductive medium and air or the dielectric layer 140, through which most of energy of the RF signal is transmitted.

The dielectric layer 140 may have a higher dielectric constant than that of air, and may affect the shape and size of the antenna package 100.

The IC package 300 includes an IC 310 and may further include a core member 360 and an electrical connection structure 330.

The IC 310 may generate an RF signal by performing frequency conversion, amplification, filtering, and phase control on a base signal, and may generate a base signal from the RF signal on a similar principle. The base signal has a frequency lower than that of the RF signal, and may have a base band frequency or an Intermediate Frequency (IF) frequency.

The core member 360 may provide a transmission path for the base signal, and may physically support the antenna module according to an example.

The electrical connection structure 330 may include a first electrical connection structure 331 electrically connecting the core member 360 and the connection member 200 to each other, and a second electrical connection structure 332 electrically connecting the core member 360 and a set substrate to each other.

For example, the electrical connection structure 330 may have a structure such as a solder ball, a pin, a land, or a pad.

The connection member 200 is partially disposed between the antenna package 100 and the IC package 300, and has a laminated structure in which the patch antenna 110 and the IC 310 are electrically connected to each other. An electrical length between the patch antenna 110 and the IC 310 may be reduced depending on a lamination structure.

Since the RF signal has a relatively high frequency and a relatively short wavelength as compared with a frequency and a wavelength of the base signal, energy of the RF signal may be lost more in transmission than in the base signal. Since the electrical length between the antenna package 100 and the IC package 300 may be reduced by the connection member 200, energy loss when the RF signal flows between the IC 310 and the patch antenna 110 may be reduced.

The chip antenna 400 is disposed on the connection member 200, and includes a first electrode 411 electrically connected to the IC 310, a dielectric body 420 disposed on one surface of the first electrode 411, and a second electrode 412 spaced apart from the first electrode 411 and disposed on the dielectric body 420. The first and second electrodes 411 and 412 may be respectively mounted on first and second electrode pads 431 and 432 on the connection member 200.

The first electrode 411 may receive the RF signal from the IC 310 through the connection member 200, and may transmit the RF signal to the IC 310 through the connection member 200. The first electrode 411 may serve as a radiator and may have two planes.

Since the first and second electrodes 411 and 412 may be erected on an upper surface of the connection member 200, two planes may remotely transmit and/or receive RF signals in the X and/or Y directions, respectively.

An outer plane may radiate RF signals externally, and an inner plane may radiate RF signals toward the dielectric body 420 and the second electrode 412.

The second electrode 412 may serve as a reflector and thus may reflect the RF signals transmitted through the inner plane of the first electrode 411. The second electrode 412 may be electrically grounded.

The dielectric body 420 may have a dielectric constant equal to or greater than a dielectric constant of the dielectric layer 140. Therefore, a distance between the first electrode 411 and the second electrode 412 may be reduced, and miniaturization of the chip antenna 400 may be facilitated.

The antenna module may remotely transmit and/or receive RF signals omni-directionally, using the antenna package 100 and the chip antenna 400 together.

As the number of chip antennas 400 increases, the antenna module may improve a remote transmission/reception gain in the X direction and/or the Y direction.

The connection member 200 includes a first region R1 disposed between the antenna package 100 and the IC package 300, and a second region R2 extending farther than the antenna package 100 in a direction different from a laminating direction (e.g., a Z direction) of the connection member 200. For example, the second region R2 may extend farther than the antenna package 100 in a direction transverse or perpendicular to the laminating direction, such as an X direction and/or a Y direction.

The second region R2 may improve the degree of positional freedom of the connection member 200 and, thus, may provide additional layout space in addition to the antenna package 100 and the IC package 300.

The chip antenna 400 is disposed in the second region R2 of the connection member 200. Accordingly, the antenna module may easily provide an additional arrangement space of the chip antenna 400, and reduction in the size of the antenna package 100 and the IC package 300 may be facilitated.

In addition, since a plurality of chip antennas 400 may be easily disposed in the antenna module, a remote transmission/reception gain in the X direction and/or the Y direction may be easily improved.

The second region R2 of the connection member 200 may be formed using a material that is relatively more flexible than a material of the antenna package 100 or the first region R1. For example, the connection member 200 may be implemented as a Rigid-Flexible Printed Circuit Board (RFPCB), but a material of the connection member 200 is not limited to RFPCB.

The second region R2 may be flexibly bent, and thus, may be disposed relatively closer to the IC package 300 or the antenna package 100.

Therefore, in the antenna module, a substantial size increase may be avoided, while ensuring a sufficient layout space of the chip antenna 400, or a negative influence due to an increase in size, (for example, limitations in layout freedom in electronic devices, limitations in placement freedom of other elements in electronic devices, degradation of electromagnetic shielding efficiency or heat dissipation efficiency of electronic devices, or the like) may be significantly reduced.

In addition, an upper surface and/or a lower surface of the second region R2 may be inclined according to warpage of the second region R2. In this case, the first and second electrodes 411 and 412 of the chip antenna 400 may also be inclined. Accordingly, a remote transmission/reception direction of an RF signal of the chip antenna 400 may be modified.

For example, controlling the direction and position of the RF signal remote transmission/reception of the chip antenna 400 may be facilitated, and thus, external obstacles (e.g., other devices in an electronic apparatus, an electronic device user's hand, or the like) may be easily avoided, and an RF signal may therefore be efficiently transmitted and received remotely.

The second region R2 of the connection member 200 may include a rigid region R22 providing a layout space of the chip antenna 400, and a flex region R21 connecting the first region R1 and the rigid region R22 to each other and more flexible than the rigid region R22.

Accordingly, the chip antenna 400 may be stably placed in the rigid region R22 despite bending of the flex region R21.

Depending on the design, the second region R2 of the connection member 200 may not include the rigid region R22. For example, a portion of an insulating layer of the connection member 200 may provide a layout space for the chip antenna 400. In this case, the chip antenna 400 may include a dielectric body 420 that has greater flexibility than that of the dielectric layer 140, to flexibly correspond to the bending of the second region R2. For example, the dielectric body 420 may be formed of the same material as that of an insulating layer of the connection member 200, but a material of the dielectric body 420 is not limited to the material of the insulating layer of the connection member 200.

With respect to the criterion of flexibility, a force is applied to the center of one surface of a measurement object having a unit size, and the force is gradually increased until the measurement object is damaged (for example, cut or cracked), and a force applied when the measurement object is damaged may be defined as the flexibility.

Figure 2A:
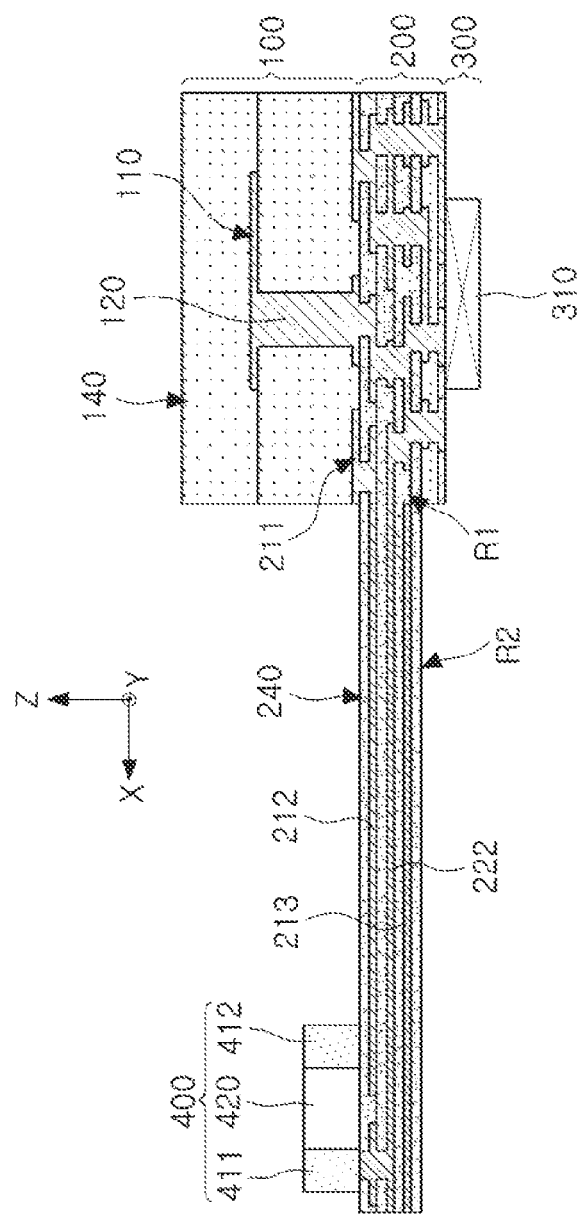
FIGS. 2A to 2C are side views of antenna modules, according to examples.
Figure 2B:
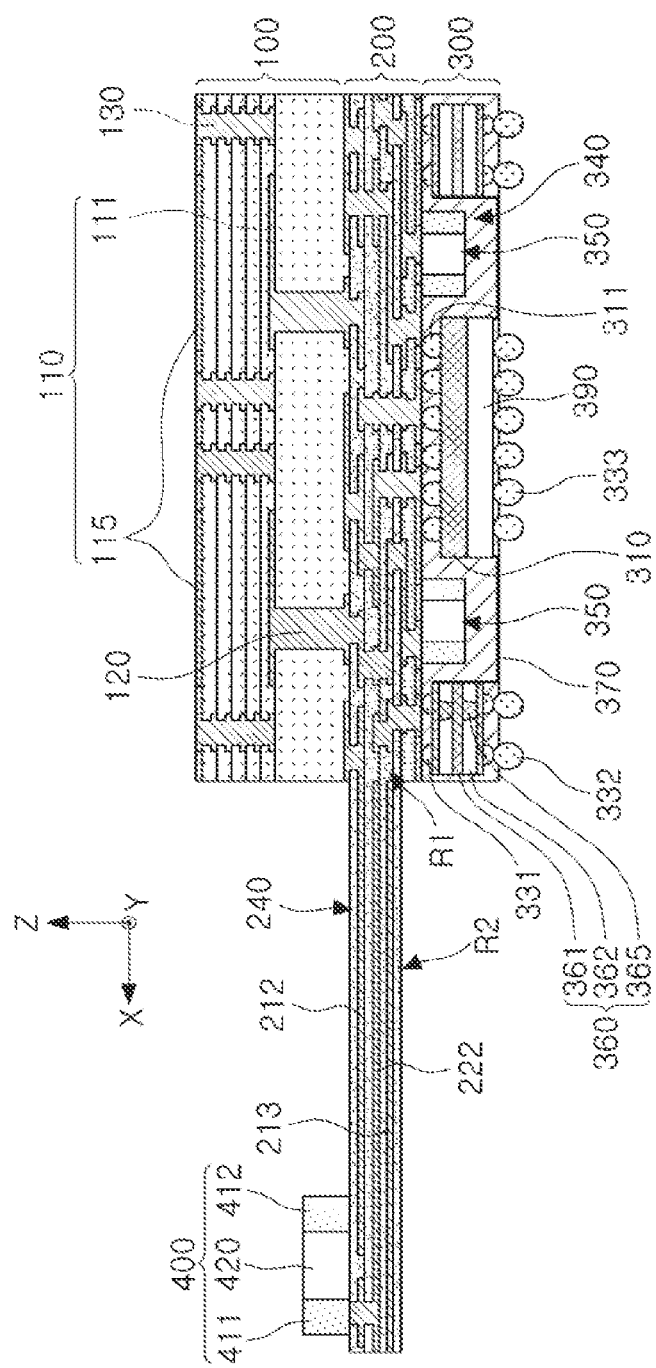
Figure 2C:
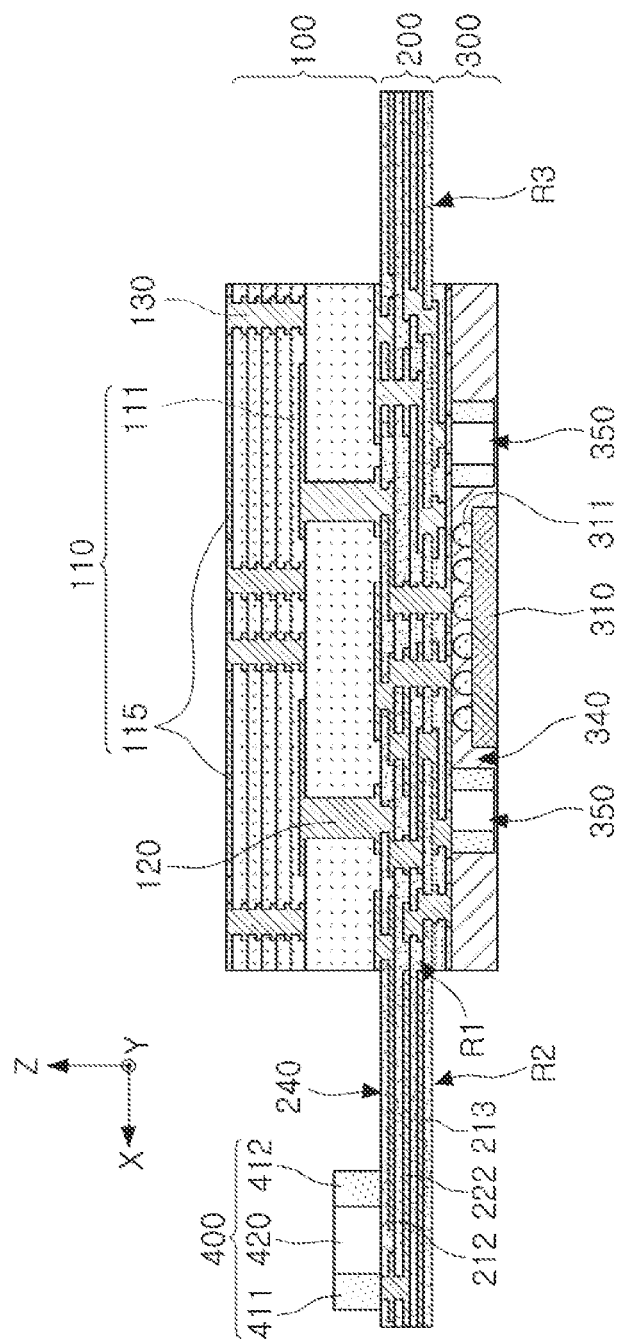

FIGS. 2A to 2C are side views of antenna modules, according to examples.

Referring to FIG. 2A, the connection member 200 may have a structure in which insulating layers 240 and conductive layers are alternately laminated. In this case, the conductive layer may include a first ground layer 211, a second ground layer 212, a third ground layer 213, and a second feed line 222.

The insulating layer 240 may be more flexible than the dielectric layer 140 of the antenna package 100. For example, the insulating layer 240 may be formed of a relatively flexible material such as polyimide or a Liquid Crystal Polymer (LCP), but the insulating layer 240 is not limited to these materials.

The first, second and third ground layers 211, 212 and 213 may be electrically grounded.

The first ground layer 211 may function as a reflector for the patch antenna 110 of the antenna package 100, and thus, may reflect the RF signal transmitted through the lower plane of the patch antenna 110 in the Z direction.

The second and third ground layers 212 and 213 may be spaced above and below the second feed line 222, and at least portions of the second and third ground layers 212 and 213 may be disposed in the second region R2 of the connection member 200.

Thus, the second and third ground layers 212 and 213 may shield the second feed line 222 from external electromagnetic noise, and thus, an influence of electromagnetic noise on the RF signal transmitted through the second feed line 222 may be reduced.

In addition, the second ground layer 212 may be electrically connected to the second electrode 412 of the chip antenna 400, thereby providing a ground to the chip antenna 400. The second ground layer 212 is connected to the first ground layer 211 such that heat of the first region R1 of the connection member 200 may be dissipated through the second region R2.

The second feed line 222 may electrically connect the first electrode 411 of the chip antenna 400 and the IC 310 to each other.

Referring to FIG. 2B, the antenna package 100 may include patch antennas 110, feed vias 120, and a coupling structure 130.

The number of the patch antennas 110 may correspond to a Z-direction gain of the antenna package 100. Thus, the size of the antenna package 100 may be increased to have a further improved Z-direction gain.

The antenna module may easily provide the arrangement space of the chip antenna 400 without substantially affecting the arrangement space of the patch antennas 110, thereby improving omnidirectional RF signal transmission/reception efficiency.

The patch antennas 110 may each include patch antenna patterns 111 and coupling patch patterns 115. The patch antenna patterns 111 may respectively function as a radiator, and the coupling patch patterns 115 may be electromagnetically coupled to the patch antenna patterns 111 to provide an additional resonance frequency point. Thus, the bandwidth of the patch antennas 110 may be easily enlarged.

The coupling structure 130 may be disposed to respectively surround the patch antennas 110 and may be electromagnetically coupled to the patch antennas 110. Thus, the bandwidth of the patch antennas 110 may be easily enlarged.

The coupling structure 130 may improve electromagnetic isolation between the patch antennas 110 when the ground is provided, and may further concentrate the RF signals of the patch antennas 110 in the Z direction.

As illustrated in FIG. 2B, the IC package 300 may further include a connection pad 311, a third electrical connection structure 333, an encapsulant 340, a passive component 350, and a heat slug 390.

The connection pad 311 may electrically connect the IC 310 and the connection member 200 to each other. For example, the IC 310 may include an upper active surface and a lower inactive surface, and the connection pads 311 may be disposed on the active surface. For example, the IC 310 may be electrically connected to the connection member 200 through the active surface.

The passive component 350 refers to a component that does not receive power/control directly, such as a capacitor or an inductor. Since the chip antenna 400 is disposed in the second region R2 of the connection member 200, the IC package 300 may replace an arrangement space of the chip antenna 400 with the space for accommodating the passive component 350. Accordingly, the IC package 300 may accommodate a greater number of passive components 350, relative to a unit size of the passive component 350.

The encapsulant 340 may seal the IC 310 and the passive component 350. For example, the encapsulant 340 may be implemented as a Photo Imageable Encapsulant (PIE), an Ajinomoto Build-up Film (ABM), an epoxy molding compound (EMC), or the like.

The heat slug 390 may contact the inactive surface of the IC 310 or may be disposed below the inactive surface. Accordingly, the heat slug 390 may easily absorb heat generated in the IC 310. The heat slug 390 has a lump shape and may accommodate a relatively large amount of heat.

The third electrical connection structure 333 may be connected to the heat slug 390, and thus may provide a dissipation path of heat accommodated in the heat slug 390. The third electrical connection structure 333 may be connected to a set substrate, and thus, a portion of the heat received in the heat slug 390 may be transferred to the set substrate.

The antenna module may easily provide the arrangement space of the chip antenna 400 without substantially affecting the arrangement space of the respective components included in the IC package 300, and thus, omnidirectional RF signal transmission/reception performance may be easily improved, relative to the size of the antenna module.

Referring to FIG. 2B, the core member 360 may include core wiring layers 361, core insulating layers 362, and core vias 365, and a plating member 370, and may surround the IC 310.

The core member 360 and the plating member 370 may be implemented through a fan-out panel level package (FOPLP) method, but are not limited to such a method. In this case, the term "fan-out" refers to a structure in which an electrical connection path is diverted from the connection pad 311 of the IC 310 in the X direction and/or the Y direction, and the electrical path may extend to a position corresponding to the patch antennas 110 and/or the core member 360.

The core wiring layers 361 and the core insulating layers 362 may be alternately laminated. For example, the core wiring layers 361 may be formed of the same material as that of the first, second and third ground layers 211, 212 and 213 of the connection member 200, while the core insulating layers 362 may be formed of the same material as that of the rigid region R22 of the connection member 200. However, the materials of the core wiring layers 361 and the core insulating layers 362 are not limited to these examples.

The core vias 365 may be electrically connected to the core wiring layers 361 and may be electrically connected to the first and second electrical connection structures 331 and 332. The core vias 365 may function as a transmission path for the base signal to be generated in the IC 310 or provided to the IC 310.

The plating member 370 may be disposed on a side surface of the core member 360 and may be electrically connected to the heat slug 390. Accordingly, the plating member 370 may provide a dissipating path of heat accommodated in the heat slug 390. In addition, the plating member 370 may electromagnetically isolate the IC 310 from the outside thereof.

Referring to FIG. 2C, the IC package 300 may not include the core member 360 illustrated in FIG. 2B. In this example, the connection member 200 may further include a third region R3 extending farther than the antenna package 100, in a direction different from an extending direction of the second region R2. For example, the third region R3 may extend farther than the antenna package 100 in a direction transverse or perpendicular to the laminating direction of the connection member 200, such as an X direction and/or a Y direction that is different from the extending direction of the second region R2.

The third region R3 may provide a layout space of a base signal line through which the base signal passes. The third region R3 may be implemented with a material that is more flexible than a material of the antenna package 100 or the first region R1. As a result, the third region R3 may be bent flexibly, and thus, may be disposed more freely on the set substrate. For example, the third region R3 may be arranged more freely with respect to a set substrate.

Figure 3A:
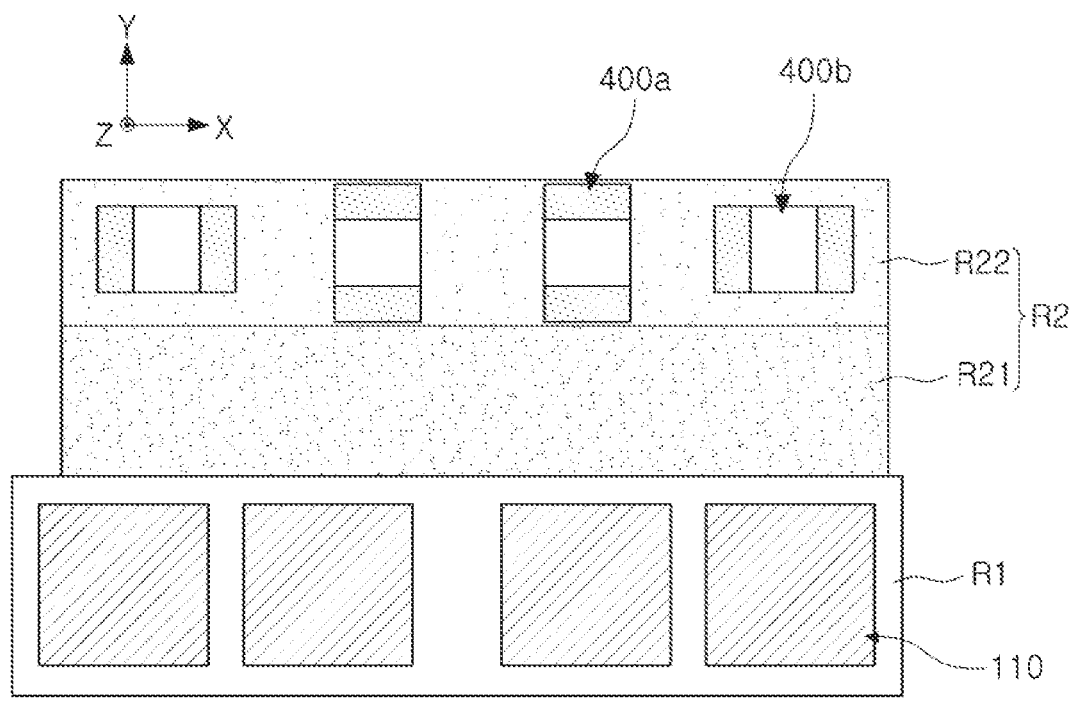
FIGS. 3A and 3B are plan views illustrating antenna modules, according to examples.
Figure 3B:
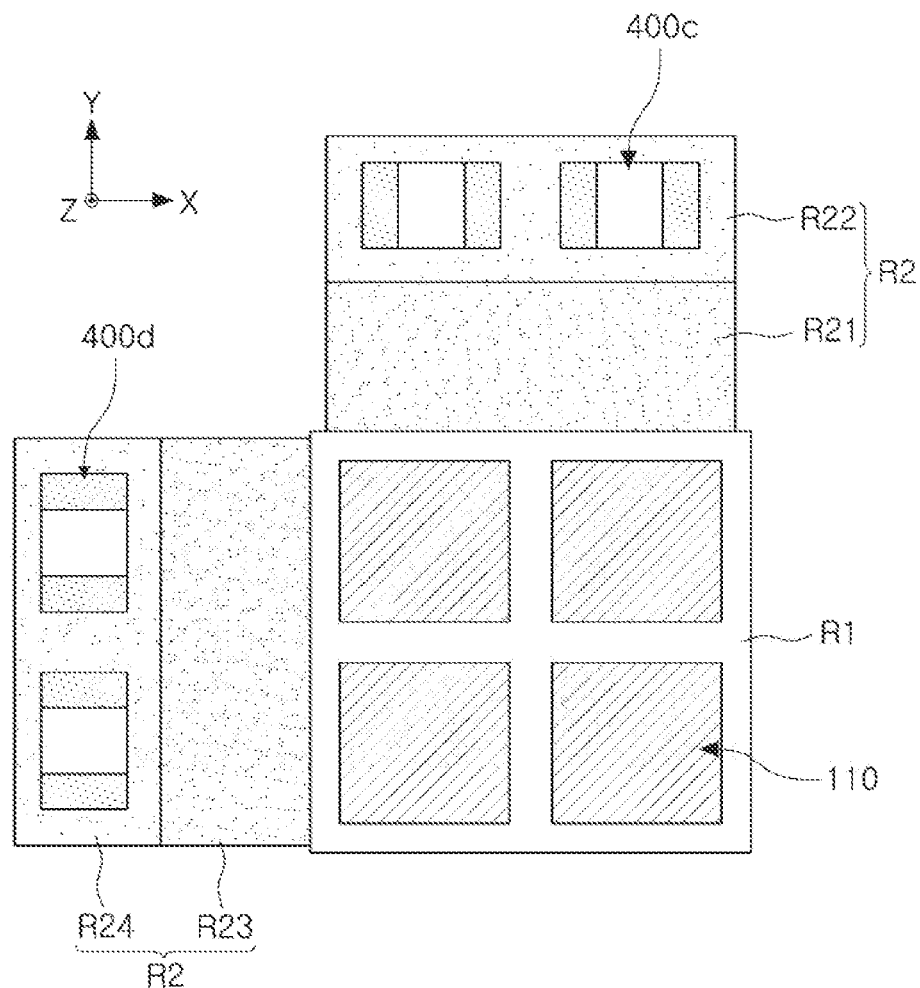

FIGS. 3A and 3B are plan views illustrating antenna modules, according to examples.

Referring to FIG. 3A, an antenna module may include chip antennas 400a and 400b disposed in a second region R2. The chip antennas 400a and 400b may be spaced apart from each other and may be disposed to face in different directions.

Since the chip antennas 400a and 400b may be relatively freely disposed in the second region R2, the antenna module may more easily improve omnidirectional transmission/reception efficiency of RF signals.

Referring to FIG. 3B, the second region R2 may include a first flex region R21, a first rigid region R22, a second flex region R23, and a second rigid region R24. The first flex region R21 and the first rigid region R22 extend in a Y direction in the first region R1, and the second flex region R23 and the second rigid region R24 extend in the X direction in the first region R1, and may correspond to the third region R3 illustrated in FIG. 2C.

The antenna module illustrated in FIG. 3B may include the chip antennas 400c and 400d disposed in the first and second rigid regions R22 and R24, respectively. Accordingly, the arrangement positions of the chip antennas 400c and 400d may be set more freely, so that external obstacles at the time of transmitting and receiving RF signals of the plurality of chip antennas 400a and 400b may be more easily avoided.

Figure 4A:
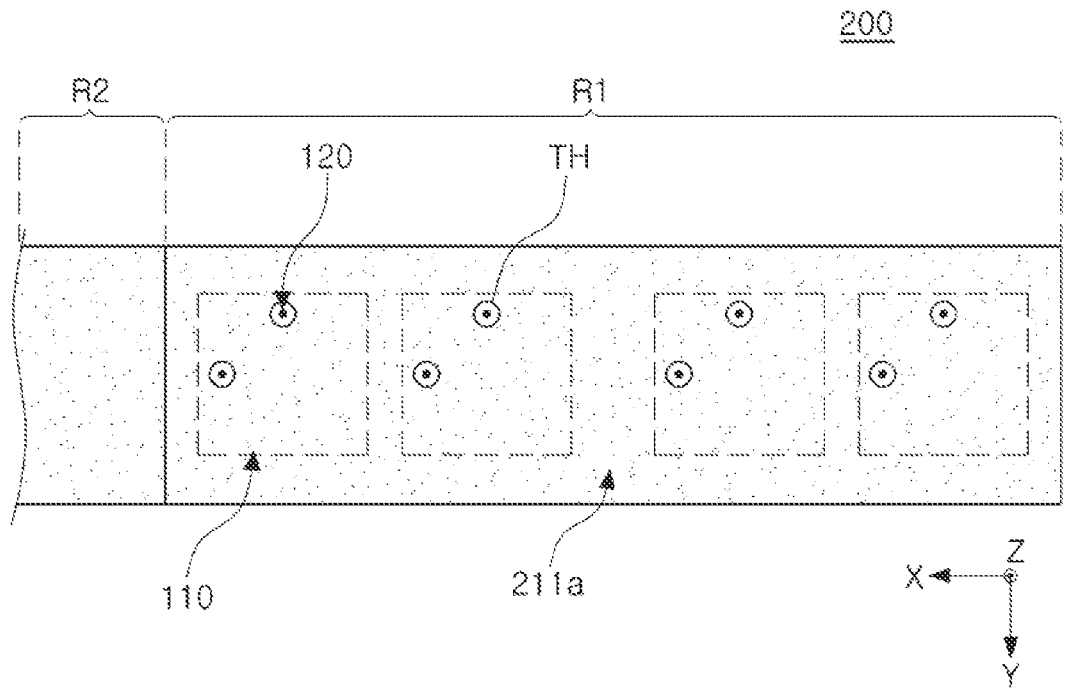
FIGS. 4A and 4B are plan views illustrating a first region of a connection member of an antenna module, according to an example.
Figure 4B:
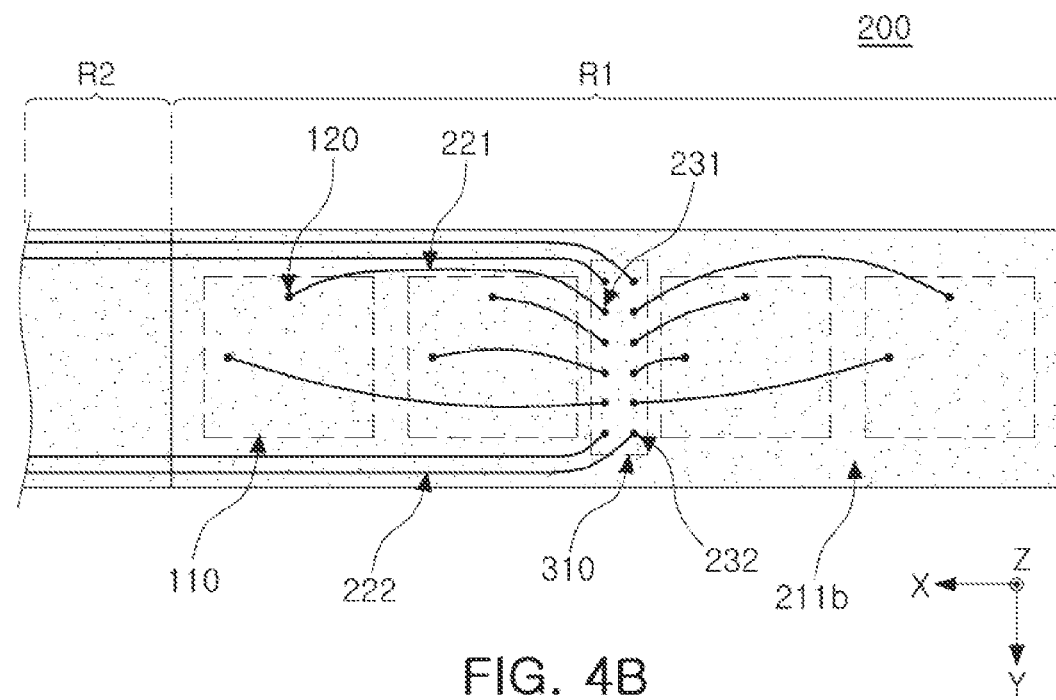

FIGS. 4A and 4B are plan views illustrating a first region of the connection member 200 of an antenna module, according to an example.

Referring to FIG. 4A, a first ground layer 211a may include through holes TH, and may be disposed to overlap the arrangement space of the patch antenna 110 in the Z direction.

Feed vias 120 may be disposed to penetrate through the through holes TH, respectively.

Referring to FIG. 4B, the wiring ground layer 211b is disposed to be closer to the IC than the first ground layer 211a illustrated in FIG. 4A, and provides layout spaces of the first and second feed lines 221 and 222. The wiring ground layer 211b may be spaced apart from the first and second feed lines 221 and 222 and may have a shape surrounding the first and second feed lines 221 and 222.

The first feed line 221 may electrically connect the feed via 120 and the first wire via 231.

The second feed line 222 may extend from a second wiring via 232 to the second region R2, and may be electrically connected to the chip antenna 400.

The first and second wiring vias 231 and 232 may be disposed to overlap the arrangement space of the IC 310 in the Z direction, and may be electrically connected to the IC 310.

Figure 5A:
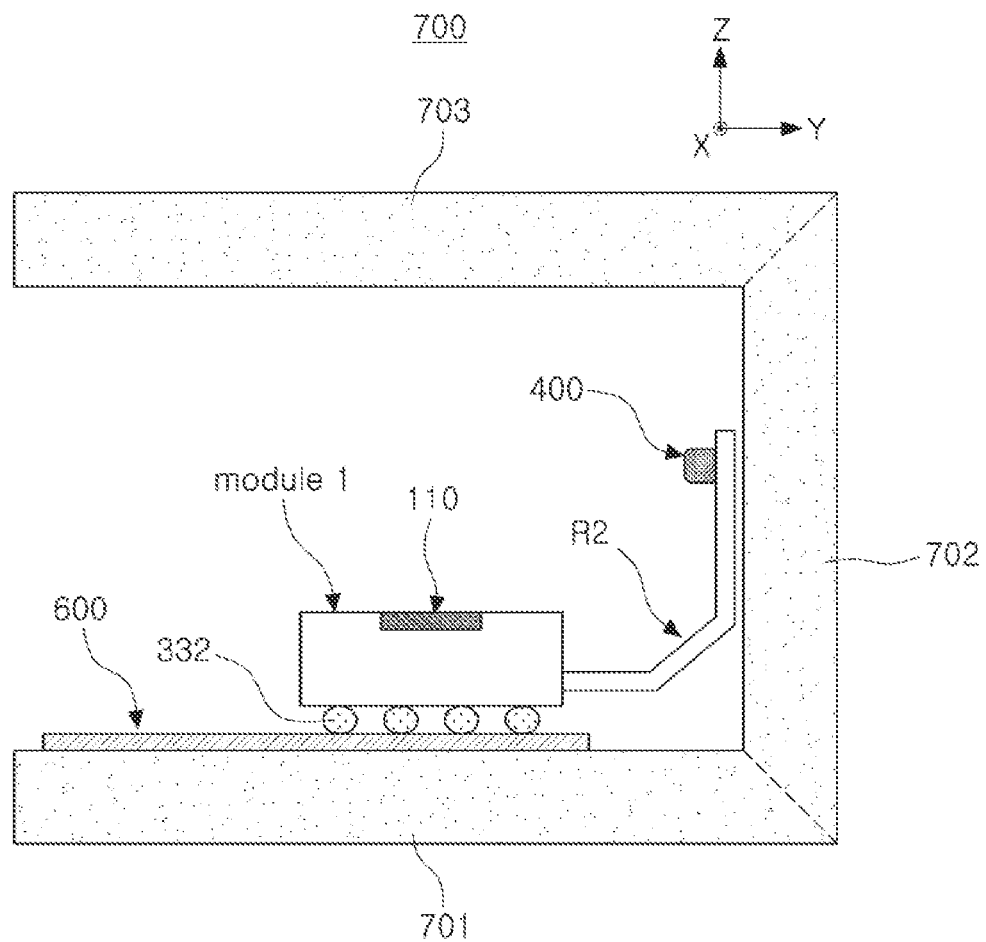
FIGS. 5A and 5B are side views illustrating antenna modules and an electronic apparatus, according to examples.
Figure 5B:
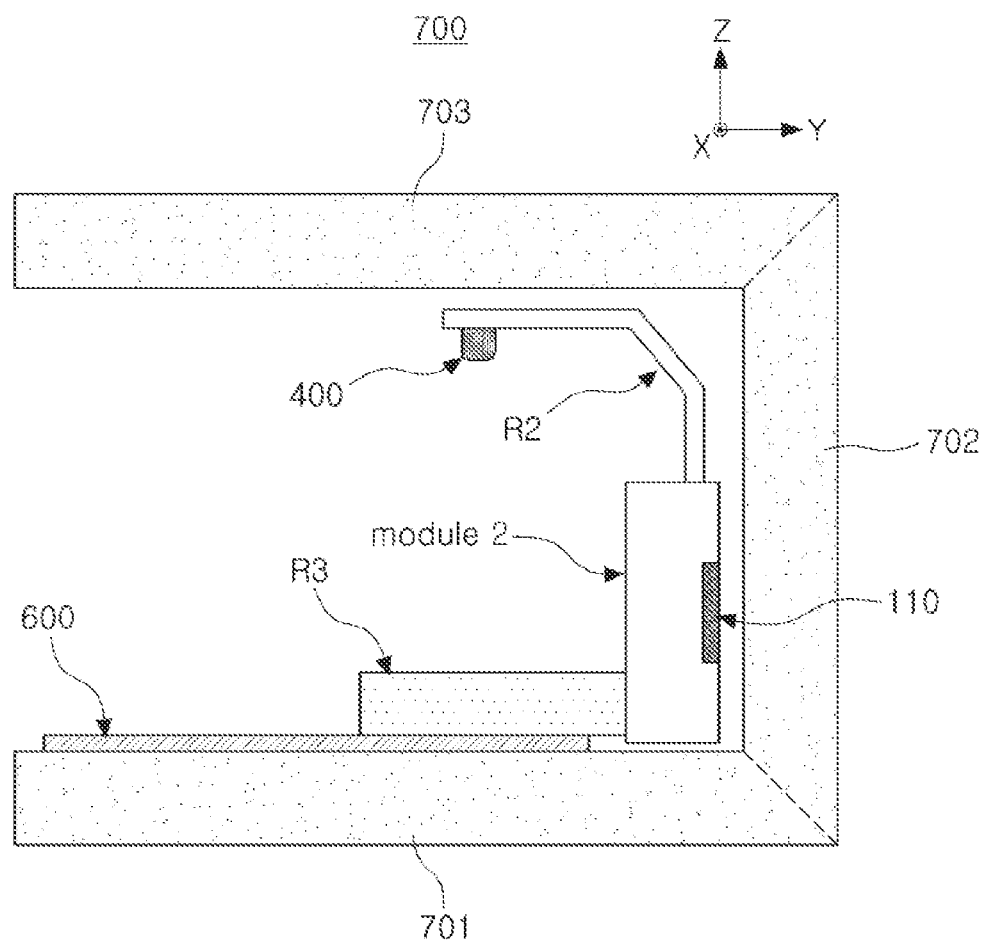

FIGS. 5A and 5B are side views illustrating antenna modules and an electronic device 700, according to examples.

Referring to FIG. 5A, the electronic device 700 includes a case including a lower surface 701, a side surface 702, and an upper surface 703, and includes a set substrate 600 disposed in the case.

An antenna module (module1), according to an example, may be mounted on a set substrate 600 through a second electrical connection structure 332.

The antenna module (module1) may be disposed such that the plane of the patch antenna 110 faces the lower surface 701 or the upper surface 703 of the case.

The chip antenna 400 may be disposed in the second region R2 of the antenna module (module1), and therefore, may be disposed closer to the side surface 702 of the case than the patch antenna 110.

Referring to FIG. 5B, an antenna module (module2), according to an example, may be flexibly connected to the set substrate 600 through the third region R3.

The antenna module (module2) may be disposed such that the plane of the patch antenna 110 faces the side surface 702 of the case.

The chip antenna 400 may be disposed in the second region R2 of the antenna module (module2) and may be disposed farther away from the side surface 702 of the case than the patch antenna 110. Thus, the electronic device 700 may have a more enhanced gain through the side surface 702 of the case, and may more effectively avoid external obstacles through the lower surface or the upper surface 701 or 703 of the case, to thereby remotely transmit/receive an RF signal.

For example, the electronic device 700 may include a display panel, and a display surface of the display panel may face the Z direction. In this case, the chip antenna 400 may be disposed to remotely transmit and receive an RF signal by avoiding the hands of a user of the display panel or the electronic device.

Figure 6A:
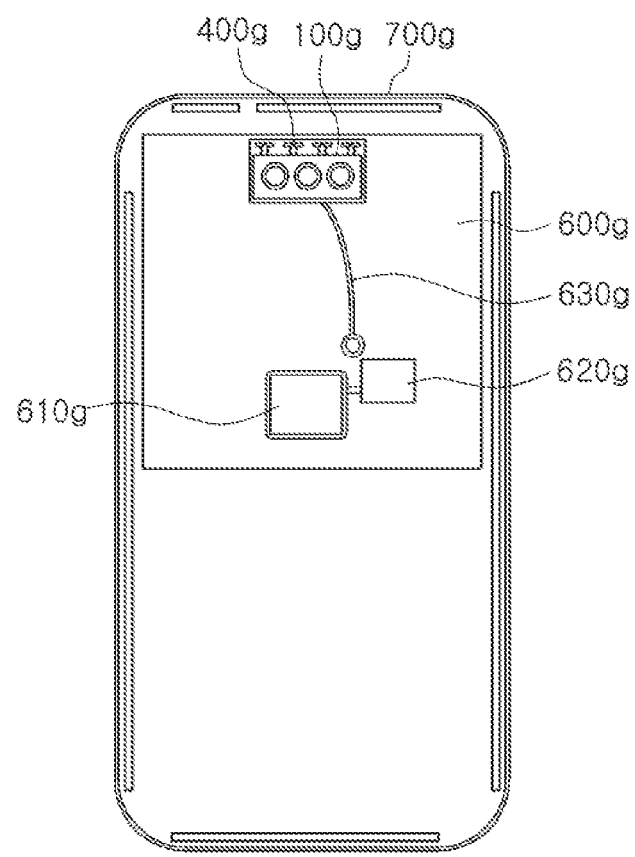
FIGS. 6A and 6B are plan views illustrating electronic devices, according to examples.
Figure 6B:
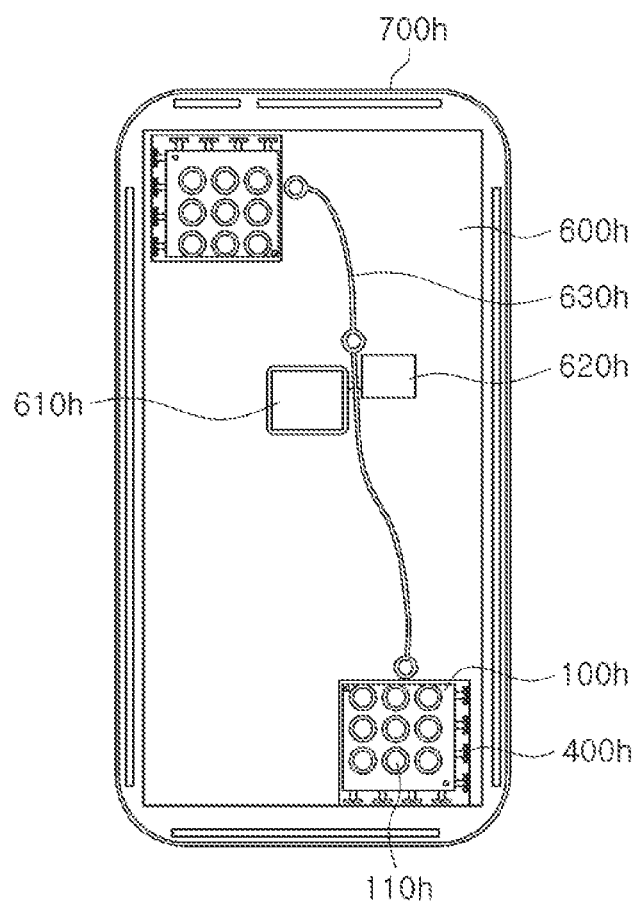

FIGS. 6A and 6B are plan views illustrating electronic devices, according to examples.

Referring to FIG. 6A, an antenna module including an antenna package 100g and a chip antenna 400g may be disposed on a set substrate 600g, and may be disposed in an electronic device 700g, according to an example.

The electronic device 700g may be a smartphone, a personal digital assistant, a digital video camera, a digital still camera, a network system, a computer, a monitor, a tablet PC, a laptop computer, a netbook computer, a television set, a video game, a smartwatch, an automobile, or the like, but is not limited to these examples.

A communication module 610g and a second IC 620g may be further disposed on the set substrate 600g. The antenna module may be electrically connected to the communication module 610g and/or the second IC 620g through a coaxial cable 630g.

The communication module 610g may include at least a portion of a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like, to perform digital signal processing.

The second IC 620g may perform analog-to-digital conversion, amplification of an analog signal, filtering, and frequency conversion to generate a base signal. The base signal input and output through the second IC 620g may be transmitted to the antenna module through a coaxial cable. For example, when the base signal is an IF signal, the second IC 620g may be implemented as an Intermediate Frequency Integrated Circuit (IFIC). When the base signal is a baseband signal, the second IC 620g may be implemented as a Base Band Integrated Circuit (BBIC).

For example, the base signal may be transmitted to the IC through an electrical connection structure, a core via, and a circuit wiring. The IC may convert the base signal into an RF signal in a millimeter wave (mmWave) band.

Referring to FIG. 6B, a plurality of antenna modules each including an antenna package 100h, a patch antenna 110h and a chip antenna 400h may be disposed to be adjacent to a boundary of one side surface of the electronic device 700h and a boundary of another side surface of the electronic device 700h, on a set substrate 600h of the electronic device 700h. A communication module 610h and a second IC 620h may be further disposed on the set substrate 600h. The plurality of antenna modules may be electrically connected to the communication module 610h and/or the second IC 620h through a coaxial cable 630h.

The patch antenna pattern, the coupling patch pattern, the feed via, the ground layer, the coupling structure, the feed line, the wiring via, the electrical connection structure, the plating member, the heat slug, the electrode, the electrode pad and the connection pad may include a metal material, for example, a conductive material, such as copper (Cu), aluminum (Al), silver (Ag), tin (Sn), gold (Au), nickel (Ni), lead (Pb), titanium (Ti), or alloys thereof, and may be formed by a plating method, such as chemical vapor deposition (CVD), physical vapor deposition (PVD), sputtering, subtractive, additive, a semi-additive process (SAP), a modified semi-additive process (MSAP), or the like, but are not limited to these examples, and may be modified depending on design specifications (e.g., flexibility, a dielectric constant, ease of bonding among plural substrates, durability, costs, or the like).

The insulating layer and the dielectric layer disclosed herein may be implemented by a prepreg resin, FR4, Low Temperature Co-fired Ceramic (LTCC), Liquid Crystal Polymer (LCP), a thermosetting resin such as epoxy resin, a thermoplastic resin such as polyimide, or a resin formed by impregnating these resins in a core material such as a glass fiber, a glass cloth, a glass fabric, or the like, together with an inorganic filler, Ajinomoto Build-up Film (ABF) resin, Bismaleimide Triazine (BT) resin, a photoimageable dielectric (PID) resin, a copper clad laminate (CCL), an insulating material of ceramic series, or the like.

The RF signals described herein may be used in various communications protocols such as Wi-Fi (IEEE 802.11 family or the like), WiMAX (IEEE 802.16 family or the like), IEEE 802.20, Long Term Evolution (LTE), Ev-DO, HSPA+, HSDPA+, HSUPA+, EDGE, GSM, GPS, GPRS, CDMA, TDMA, DECT, Bluetooth, 3rd Generation (3G), 4G, 5G and various wireless and wired protocols designated thereafter, but an example thereof is not limited thereto. Further, the frequency of the RF signal (e.g., 24 GHz, 28 GHz, 36 GHz, 39 GHz, 60 GHz) is greater than the frequency of the IF signal (e.g., 2 GHz, 5 GHz, 10 GHz or the like).

As set forth above, according to an example, providing X-direction and/or Y-direction transmission/reception performance may be facilitated without substantial sacrifice in Z-directional antenna performance, for example, a gain, a bandwidth, directivity or the like, or an overall size of an antenna module.

According to an example, external obstacles (e.g., other devices in an electronic device, an electronic device user's hand, or the like) may be easily avoided, and thus, an RF signal may be efficiently transmitted and received remotely.

The communication modules 610*g* and 610*h* in FIGS. 6A and 6B that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna module, comprising:
an antenna package comprising patch antennas and a dielectric layer providing arrangement areas to the patch antennas;
a connection member connected to the antenna package and comprising an insulating layer having a flexibility greater than a flexibility of the dielectric layer; and
chip antennas connected to the connection member and comprising dielectric bodies disposed to be spaced apart from each other, first electrodes disposed on first sides of the dielectric bodies, and second electrodes disposed on second sides of the dielectric bodies,
wherein the connection member further comprises:
first feed lines electrically connected to the patch antennas;
second feed lines electrically connected to the first electrodes of the chip antennas; and
a ground layer disposed between at least a portion of the first and second feed lines and the antenna package.

2. The antenna module of claim 1, wherein the second electrodes are electrically connected to the ground layer.

3. The antenna module of claim 1, further comprising feed vias electrically connected to the first feed lines and disposed to penetrate through the ground layer.

4. The antenna module of claim 1, further comprising:
first electrode pads disposed between the connection member and the first electrodes; and
second electrode pads disposed between the connection member and the second electrodes,
wherein the chip antennas are mounted on the first and second electrode pads.

5. The antenna module of claim 1, wherein each of the dielectric bodies is disposed between each of the first electrodes and each of the second electrodes.

6. The antenna module of claim 1, wherein each of the first and second electrodes has a planar shape.

7. The antenna module of claim 1, wherein the patch antennas comprise:
patch antenna patterns disposed on a first layer of the antenna package; and
coupling patch patterns disposed on a second layer of the antenna package.

8. The antenna module of claim 1, wherein the antenna package further comprises a coupling structure surrounding at least a portion of the patch antennas.

9. The antenna module of claim 1, further comprising an integrated circuit (IC) connected to the first and second feed lines.

10. The antenna module of claim 9, wherein the IC is disposed on the connection member.

11. The antenna module of claim 1, wherein the connection member comprises a first region on which the antenna package is disposed and a second region on which at least a portion of the chip antennas is disposed, and
wherein the first electrodes are disposed to be not parallel with the second region.

12. The antenna module of claim 11, wherein the connection member further comprises a third region extending in a direction different from a direction in which the second region extends from the first region.

13. The antenna module of claim 12, wherein the chip antennas comprise first chip antennas disposed on the second region and second chip antennas disposed on the third region.

14. The antenna module of claim 11, wherein the second region of the connection member comprises:
a rigid region providing a layout space of the chip antenna; and
a flex region connecting the first region of the connection member to the rigid region, and
wherein the flex region is more flexible than the rigid region.

15. The antenna module of claim 11, wherein a thickness of the first region is greater than a thickness of the second region.

16. An electronic device, comprising:
the antenna module of claim 1; and
a case accommodating the antenna module.

17. The electronic device of claim 16, wherein the patch antennas are disposed such that planes of the patch antennas face an upper surface of the case or a lower surface of the case, and
wherein each of distances by which the chip antennas are spaced from a side surface of the case is less than each of distances by which the patch antennas are spaced from the side surface of case.

18. The electronic device of claim 16, wherein the connection member comprises a first region on which the antenna package is disposed, a second region on which at least a portion of the chip antennas is disposed, and a third region extending in a direction different from a direction in which the second region extends from the first region.

19. The electronic device of claim 18, wherein the chip antennas comprise first chip antennas disposed on the second region and second chip antennas disposed on the third region.

20. The electronic device of claim 18, further comprising a set substrate accommodated by the case,
wherein the third region is connected between the set substrate and the antenna module.

* * * * *